(12) United States Patent
Winniczek et al.

(10) Patent No.: US 8,871,105 B2
(45) Date of Patent: Oct. 28, 2014

(54) METHOD FOR ACHIEVING SMOOTH SIDE WALLS AFTER BOSCH ETCH PROCESS

(75) Inventors: Jaroslaw W. Winniczek, Daly City, CA (US); Frank Y. Lin, Fremont, CA (US); Alan J. Miller, Moraga, CA (US); Qing Xu, Fremont, CA (US); Seongjun Heo, Pleasanton, CA (US); Jin Hwan Ham, Soeul (KR); Sang Joon Yoon, Gyeonggi-do (KR); Camelia Rusu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 135 days.

(21) Appl. No.: 13/416,465

(22) Filed: Mar. 9, 2012

(65) Prior Publication Data

US 2013/0237062 A1 Sep. 12, 2013

Related U.S. Application Data

(60) Provisional application No. 61/485,282, filed on May 12, 2011.

(51) Int. Cl.
*H01L 21/302* (2006.01)
*H01L 21/3065* (2006.01)
*H01L 21/308* (2006.01)

(52) U.S. Cl.
CPC ...... *H01L 21/30655* (2013.01); *H01L 21/3086* (2013.01)

USPC .............. 216/41; 216/46; 216/67; 438/696; 438/700; 438/702; 438/710; 438/714; 438/719

(58) Field of Classification Search
None
See application file for complete search history.

(56) References Cited

U.S. PATENT DOCUMENTS

| | | | |
|---|---|---|---|
| 5,010,378 A * | 4/1991 | Douglas | 257/301 |
| 5,387,314 A * | 2/1995 | Baughman et al. | 216/27 |
| 6,846,746 B2 * | 1/2005 | Rattner et al. | 438/706 |
| 6,924,235 B2 | 8/2005 | Johnson et al. | |
| 7,425,507 B2 | 9/2008 | Lake | |
| 7,622,394 B2 | 11/2009 | Ikegami | |
| 7,687,916 B2 | 3/2010 | Lake | |
| 2004/0097077 A1 * | 5/2004 | Nallan et al. | 438/689 |
| 2007/0281474 A1 * | 12/2007 | Suzuki et al. | 438/677 |

* cited by examiner

*Primary Examiner* — Anita Alanko
(74) *Attorney, Agent, or Firm* — Beyer Law Group LLP

(57) ABSTRACT

A method is provided for etching silicon in a plasma processing chamber, having an operating pressure and an operating bias. The method includes: performing a first vertical etch in the silicon to create a hole having a first depth and a sidewall; performing a deposition of a protective layer on the sidewall; performing a second vertical etch to deepen the hole to a second depth and to create a second sidewall, the second sidewall including a first trough, a second trough and a peak, the first trough corresponding to the first sidewall, the second trough corresponding to the second sidewall, the peak being disposed between the first trough and the second trough; and performing a third etch to reduce the peak.

19 Claims, 6 Drawing Sheets

METHOD FOR ACHIEVING SMOOTH SIDE WALLS AFTER BOSCH ETCH PROCESS

CROSS-REFERENCE TO RELATED APPLICATIONS

This application claims benefit to U.S. provisional patent application Ser. No. 61/485,282, filed May 12, 2011, the entire disclosure of which is fully incorporated herein by reference.

BACKGROUND

Deep aspect ratio silicon etching is one of the principal technologies currently being used to fabricate microstructure devices, and is an enabling technology for many microelectromechanical systems (MEMS) applications. A conventionally used single-crystal silicon deep aspect ratio etch process is based upon a cyclic plasma etch/polymer deposition method, also known as Rapid Alternating Parameters (RAP) process, or a Bosch process.

FIGS. 1A-F illustrate a conventional method of etching silicon in a Bosch process.

FIG. 1A illustrates a first step in the conventional Bosch etching process.

As shown in the figure, a silicon layer 100 has a top surface 102, upon which a photoresist mask 104 is disposed. Photoresist mask 104 includes a window 106, wherein a portion of surface 102 is exposed.

Silicon layer 100 with photoresist mask 104 is placed in a standard silicon etching chamber to begin the etching process.

FIG. 1B illustrates a second step in the conventional Bosch etching process.

As shown in the figure, the portion of silicon layer 100 that is exposed through window 106 has been etched so as to create via 108. Via 108 includes a side wall 110 and a bottom surface 112.

Via 108 is created by generating an etching gas plasma in the etching chamber. An example gas used to etch silicon is $SF_6$, however other gases may be used. The etch depth is controlled by introducing the gas into the chamber at a specific flow rate and pressure for a certain amount of time, with silicon layer 100 at a specific voltage, or bias, and RF power is provided to form an etch plasma. The gas removes the silicon in an isotropic manner. Isotropy is uniformity in all directions. As such, the etching process removes silicon in all directions equally. In three-dimensional space, the result of the isotropic removal is a spherical hole. This is indicated in the figure by the circular shape of side wall 110 and bottom surface 112 of via 108 in two-dimensional space.

FIG. 1C illustrates a third step in the conventional Bosch etching process.

As shown in the figure, protective layer 116 is disposed upon both a top surface 114 of photoresist mask 104, side wall 110 and bottom surface 112 of via 108.

Protective layer 116 may include a polymer that decreases lateral etching as compared to vertical etching. Accordingly, the width of via 108 does not increase throughout the process. While other materials may be used, one non-limiting example of a material used for a protective layer is $C_4F_8$.

FIG. 1D illustrates a fourth step in the conventional Bosch etching process.

As shown in the figure, most of protective layer 116 has been removed to leave protective surface 118 disposed on side wall 110 of via 108. Protective surface 118 does not cover bottom surface 112. As such, bottom surface 112 is exposed through a window 120 of protective surface 118.

In order to continue vertical etching into silicon layer 100, without lateral etching, it is necessary to clear protective layer 116 from bottom surface 112, while maintaining protective surface 118 on side wall 110. Without protective surface 118, additional etching steps would increase the width of via 108 due to the isotropic nature of the etching process. Protective layer 116 may be removed from bottom surface 112 using known methods as part of a conventional Bosch process.

FIG. 1E illustrates a fifth step in the conventional Bosch etching process. As shown in the figure, silicon layer 100 has been etched a second time to create via 126, with side walls 110 and 122 and bottom surface 124.

Due to the isotropic nature of the etching process, the second etch process removes protective layer 118 and also creates via 126. Creating via 126 does not increase the size of side wall 110 as the etching gas does not contact side wall 110 due to protective layer 118.

FIG. 1F illustrates a final via produced by multiple cycles in the conventional Bosch etching process.

As shown in the figure, silicon layer 100 has been etched a plurality of times to create via 128. The process of etching and deposition continues in an alternating fashion until a via of the desired depth is created.

The isotropic nature of the etching process tends to create vias that are essentially semi-spherical because the etching gas has no directional component and attacks all surfaces equally. The result is that each etch undercuts the previous etch such that the wall of the completed via has an undulating nature with peaks and troughs. The collection of peaks and troughs are called scallops. Depending on the processing parameters, the depth and width of the scallops can change. This will be described in greater detail with reference to FIGS. 2-3.

FIG. 2 illustrates an enlarged view of side wall 110 and 122 of FIG. 1E.

As shown in FIG. 2, side walls 110 and 122 form a scallop 202, which includes peaks 204 and 206. Scallop 202 has a width, W, measured as the longest horizontal distance between peak 204 or 206 and side wall 110. Scallop 202 also has a depth, H, measured as the vertical distance between peaks 204 and 206. Width, W, and depth, H, are variables that are controlled by the processing parameters under which the via is created. For example, one process incorporating certain parameters for a given amount of time will create scallops of a specific size. Increased exposure time, while maintaining all other parameters constant, would result in a large scallop.

If a less aggressive etching process is performed, the relative difference between the peaks and troughs of the scallops may be decreased. However, many more scallops will be formed to reach the same depth. An additional scallop is formed each time the etching process is repeated. This will be described with reference to FIG. 3.

FIG. 3 illustrates another example of side walls created by etching a via with a conventional Bosch process using different etching parameters.

As shown in the figure, a side wall 302 includes a plurality of peaks, a sample indicated by peaks 306 and 308. A scallop 310 has a width, w, measured as the longest horizontal distance between peak 306 or 308 and side wall 302. Scallop 310 also has a depth, h, measured as the vertical distance between peaks 306 and 308.

When performing a more aggressive etching process, a via of the desired depth can be created relatively quickly with a single etching step. A disadvantage of performing this aggressive etch is that, due to the isotropic nature of the etching process, the scallop created during this process would be very large.

In contrast, when performing a less aggressive etching process, creating a via of the desired depth will take more time. The increase in total processing time is a result of performing multiple etching steps for a short amount of time. The advantage of performing a less aggressive etch is that each scallop created is much smaller, however many more scallops are required to produce a via of the same depth.

For optimum semiconductor performance, the plurality of scallops created during the etching process would be completely removed, leaving a smooth-walled via. There are methods to reduce the profile of the scallops by modifying processing parameters, however there is no known method to completely eliminate scallops from the side wall of a via.

U.S. Pat. No. 6,846,746 (Ratner et al.) provides a method to reduce scallops, but not fully eliminate them, in etch applications. Scallop reduction is accomplished by oxidation of the scallop peaks, followed by an etch suitable for removal of silicon oxides. The primary gases disclosed are $CF_4$ and $O_2$, though the patent also describes a non-oxidative process with $SF_6$, and there is a brief mention of $NF_3$. The parameters disclosed for processing with $SF_6$ and $NF_3$ differ greatly. The disclosed flow range for fluorine-containing gases: is 2-50 sccm in combination with a flow of He of 2-200 sccm, at a pressure of 1-30 mtorr. Further, the process described in Ratner et al. uses a bias of 10-40V in the processing chamber. This bias directs fluorine ions to chemically react with the scalloped side walls. The chemical reaction takes a large amount of time and creates unwanted undercutting within the trench.

Published US Patent application 2009/0272717 A1 (Pamarthy et al.) also provides a method to reduce scallops, but not fully eliminate them, in etch applications. Scallop reduction is accomplished by invoking fast gas switching in an attempt to overcome the formation of scallops, however the disclosed on/off times are greater than 1 second. Additionally, the unused gas is dumped into an exhaust stream, thereby wasting about half the gas, which is undesirable. Furthermore, the proposed method results in typical scallop measurements of 1.5 microns.

The scallops discussed above are undesirable, and no conventional etching process completely eliminates scallops.

What is needed is an improved etching process that does not produce a scalloped via. This processing method must maintain the integrity of the via, meaning the via dimensions must not be increased.

BRIEF SUMMARY

The present invention provides an improved method to eliminate scallops on the side wall of a via created using a conventional etching process, like the Bosch process.

In accordance with an aspect of the present invention, a method is provided for etching silicon in a plasma processing chamber, having an operating pressure and an operating bias. The method includes: performing a first vertical etch in the silicon to create a hole having a first depth and a sidewall; performing a deposition of a protective layer on the sidewall; performing a second vertical etch to deepen the hole to a second depth and to create a second sidewall, the second sidewall including a first trough, a second trough and a peak, the first trough corresponding to the first sidewall, the second trough corresponding to the second sidewall, the peak being disposed between the first trough and the second trough; and performing a third etch to reduce the peak.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

As a result of the alternating processes of etching and deposition, the exposed surface of scallops is no longer pure silicon, but comprise a combination of silicon, fluorine, carbon and sulfur, which are byproducts of the etching process. This will be described in greater detail with reference to FIG. 4.

Figure 1A:
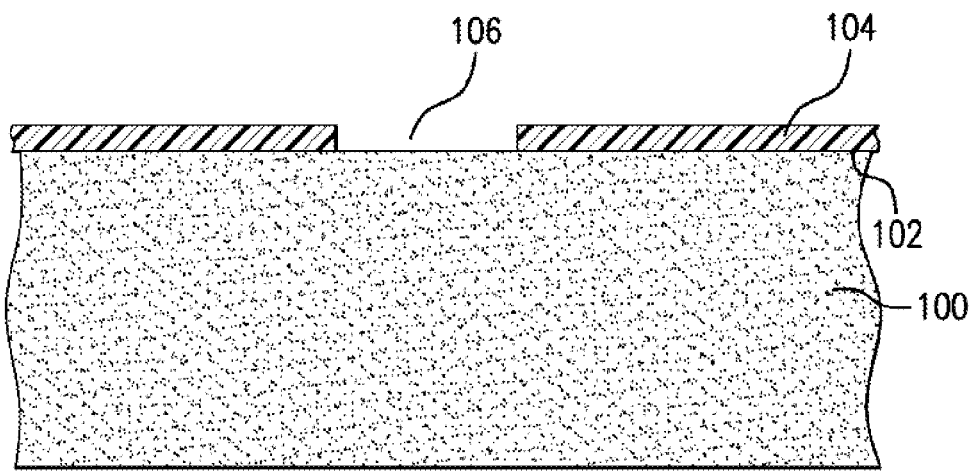
FIG. 1A illustrates a first step in the conventional Bosch etching process.
Figure 1B:
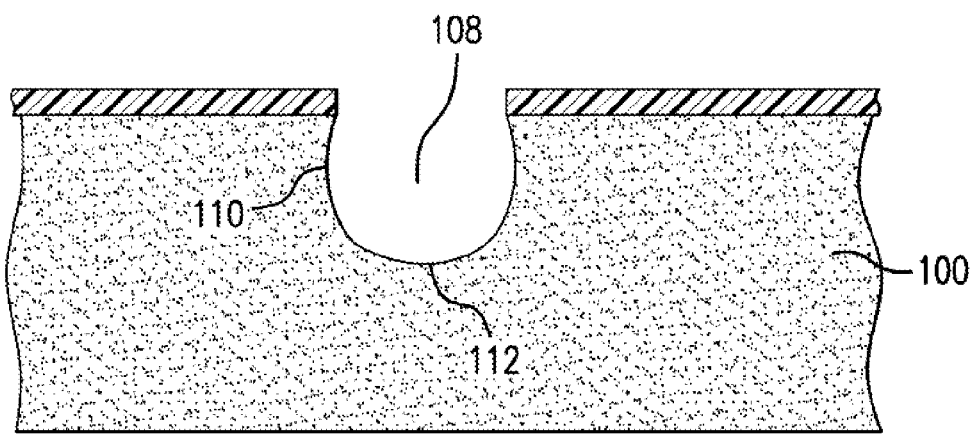
FIG. 1B illustrates a second step in the conventional Bosch etching process.
Figure 1C:
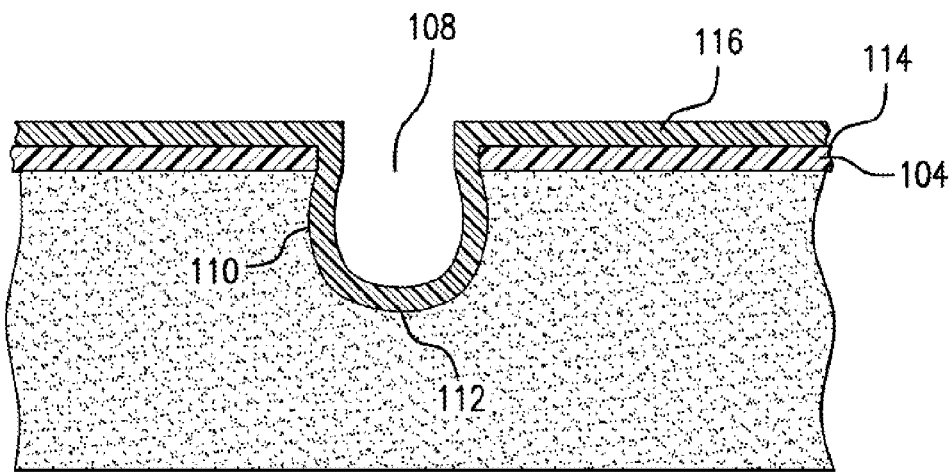
FIG. 1C illustrates a third step in the conventional Bosch etching process.
Figure 1D:
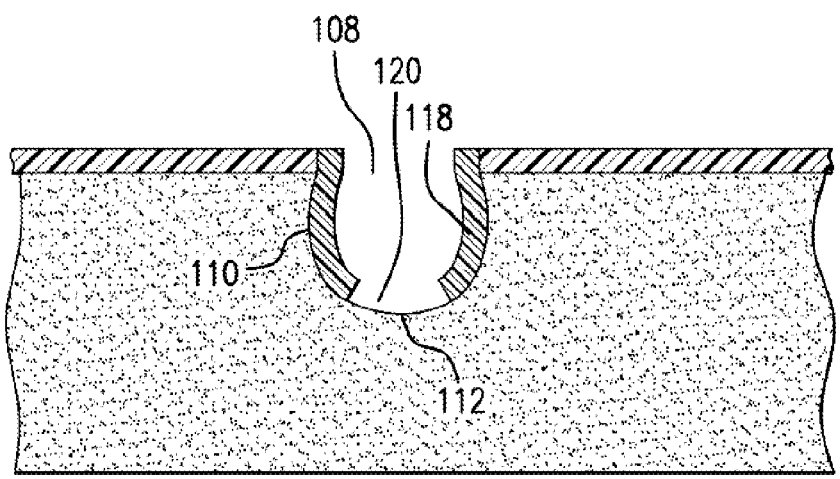
FIG. 1D illustrates a fourth step in the conventional Bosch etching process.
Figure 1E:
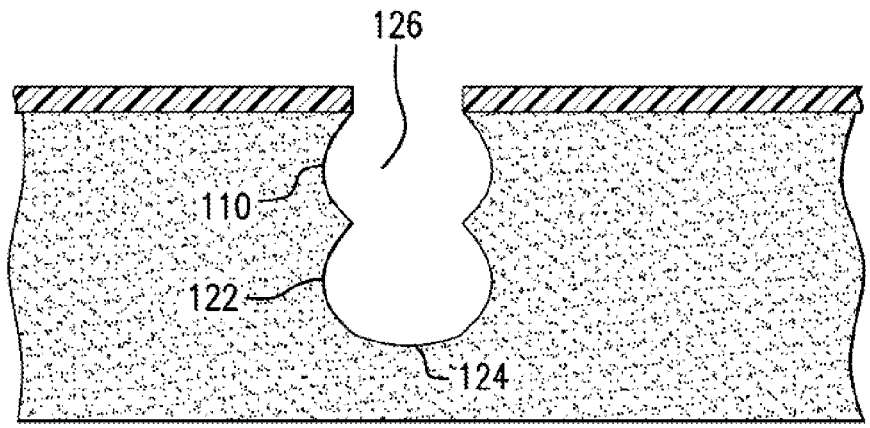
FIG. 1E illustrates a fifth step in the conventional Bosch etching process.
Figure 1F:
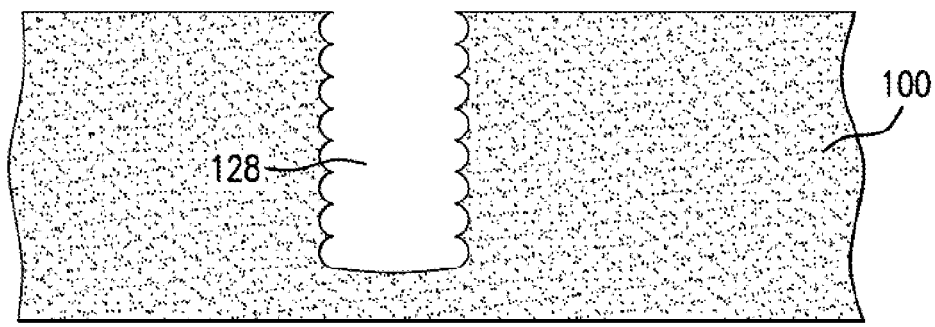
FIG. 1F illustrates a final via produced by multiple cycles in the conventional Bosch etching process.
Figure 2:
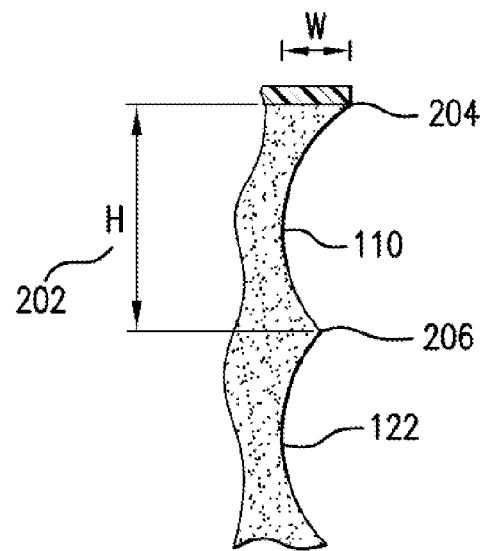
FIG. 2 illustrates an enlarged view of a side wall of FIG. 1E.
Figure 3:
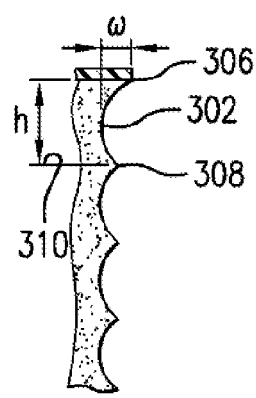
FIG. 3 illustrates another example of side walls of a via created after etching a via with a conventional Bosch process using different etching parameters.
Figure 4:
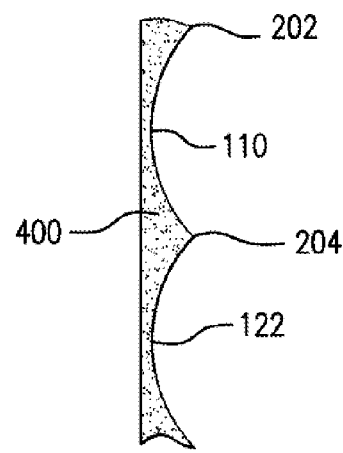
FIG. 4 illustrates an enlarged view of side walls of FIG. 1E.

FIG. 4 illustrates an enlarged view of side walls 122 and 110 of FIG. 1E.

As shown in FIG. 4, material 400 is created during the conventional silicon etching process. Material 400 is thickest at peaks 204 and 206 and thinnest at the bases of troughs 110 and 122.

Figure 5:
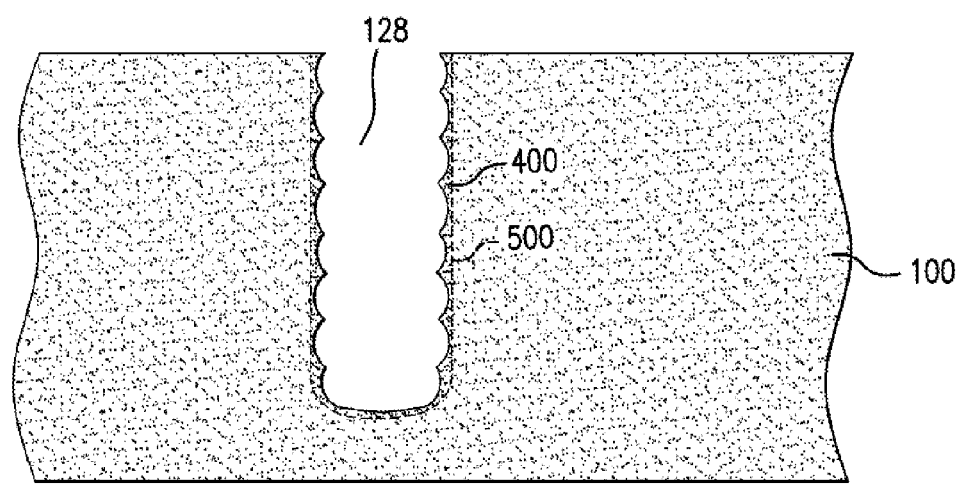
FIG. 5 illustrates a via created in silicon after a plurality of steps of a conventional silicon etching process.

FIG. 5 illustrates a via created in silicon after a plurality of steps of a conventional silicon etching process.

As shown in the figure, material 400 is disposed between via 128 and silicon layer 100. Material 400 is in contact with silicon layer 100 at boundary layer 500.

For optimum semiconductor performance, material 400, and with it, the plurality of scallops created during the etching process, would be completely removed, leaving a smooth wall of pure silicon at boundary layer 500.

In accordance with aspects of the present invention, a post-processing step is used to remove scallops created during the etching process, thus leaving a smooth-walled via. This will be further described with reference to FIG. 6.

Figure 6:
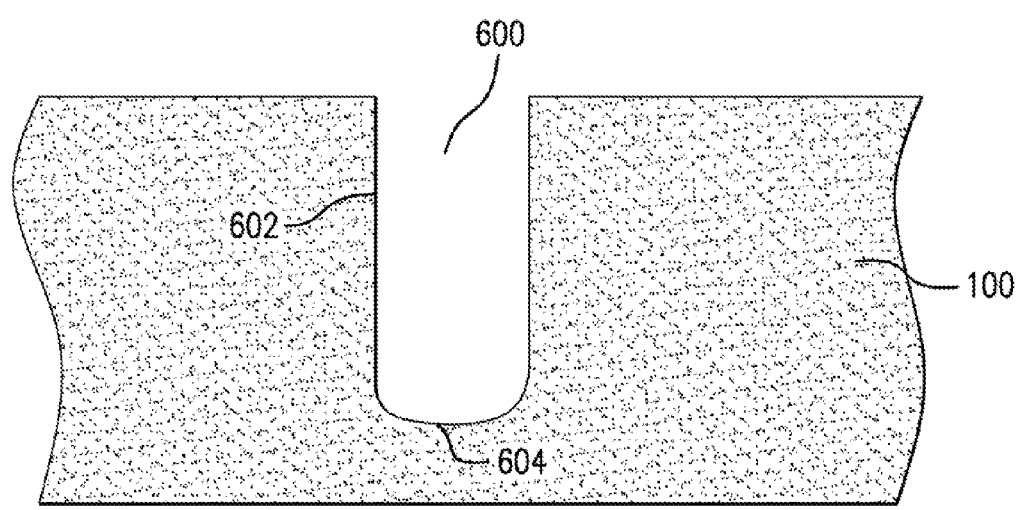
FIG. 6 illustrates a via created in silicon after a plurality of steps of a conventional silicon etching process, followed by a post-processing step in accordance with aspects of the present invention.

FIG. 6 illustrates a via created in silicon after a plurality of steps of a conventional silicon etching process, followed by a post-processing step in accordance with aspects of the present invention.

As shown in the figure, via 600 has been created in silicon layer 100. Via 600 includes a smooth side wall 602 and a bottom surface 604.

Smooth side wall 602 is created after the conventional etching process by incorporating a post-processing step to eliminate the scallops created during the etching process.

In the post-processing step, another gas is introduced that has a chemistry to selectively remove the scallops from the side wall of the via while leaving the remaining silicon intact. As non-limiting examples, the gas may include $NF_3$, $CF_4$, $SF_6$, Ar, He, $O_2$, $N_2$ and combinations thereof. In a preferred embodiment, to remove scallops from a via that is from 3 to 10 microns in diameter and 40 to 150 microns deep, gas flows of 100 to 500 sccm $CF_4$ and 300 to 1000 sccm $NF_3$ are introduced into the chamber for 15 to 180 seconds.

The pressure at which the gas is introduced to the chamber should be balanced such that the scallops at the top of the via are removed at the same rate as those at the bottom of the via. The pressure range in which scallops can be removed with the disclosed postprocessing steps is 15-100 mtorr. In a preferred embodiment, to remove scallops from a via that is 5 microns in diameter and 60 microns deep, a pressures in the range of 40 to 80 mtorr was found to be most effective. Using pressures higher than 100 mtorr can result in deformation of via profile, which is undesirable.

The operating bias within the chamber serves to direct the gas ions to the peaks of the scallops to preferentially remove the peaks while leaving the troughs unmolested, and thus not increasing the diameter of the via. The operating bias under which the scallops can be removed most effectively is 200-1000V. In a preferred embodiment, to remove scallops from a via that is 5 microns in diameter and 60 microns deep, an operating bias of 700 Volts was found to be most effective. Using a bias higher than 1000V can result in rapid removal of the photoresist mask, which is undesirable because the top layer of silicon would be left unprotected and could be damaged.

In contrast with Ratner et al., discussed above, a method in accordance with aspects of the present invention uses a much higher bias. The 200-1000V bias of the plasma processing chamber in accordance with the present invention induces ion bombardment to remove the scallops. This ion bombardment removes the scallops in a much faster time period as compared to the chemical reaction used by Ratner et al. discussed above. Further, in contrast with the chemical reaction used by Ratner et al. discussed above, the ion bombardment of the present invention drastically reduces undercutting of the via.

In summary of a preferred embodiment, removal of scallops from a via that is 3 to 10 microns in diameter and 40 to 150 microns deep is accomplished using gas flows of 100 to 500 sccm $CF_4$ and 300 to 1000 sccm $NF_3$ for 70 seconds, at a pressure of 40 to 80 mtorr with a 200 to 1000V operating bias, and transformer coupled plasma (TCP power) at 1.0 3.5 kW.

In some cases, it may be necessary to employ an intermediate step after etching is complete, but before post-processing steps discussed above, to remove the scallops. The etching process typically leaves some deposition on the sidewalls, even after the final etch is complete. When the deposition covers the troughs and not the peaks of the scallops, an intermediate step is not required and the peaks can be removed by the post-processing steps discussed above. The remaining deposition can actually act as a protective layer during scallop removal to prevent damage to the protective films, such as oxides, low k oxides and nitrides, on top of the silicon.

If the deposition partially or completely covers the peaks of the scallops, an intermediate step may be required. The intermediate step may include using a plasma of $O_2$ or a combination of $O_2$ and $CF_4$ to remove the deposition. As a non-limiting example of the intermediate step, the pressure would be 5-100 mtorr, TCP power of 500-3000 W, operating bias of 50-300V, and gas flows of 200-1000 sccm of $O_2$ and 0-10% additional flow of $CF_4$.

In other cases, there may not be enough deposition to prevent damage to the protective films on top of the silicon. In those instances, it may be necessary to add to the existing deposition layer to protect those films, as the fluorine in $NF_3$ and $CF_4$ can attack the films if they are not protected. The addition to the deposition layer may include a fluorocarbon layer that is concentrated at the top of the via. This can be achieved by using high operating pressures, non-limiting examples of which include 40-200 mtorr, and low operating biases, such as 0-100V, with TCP power in the range of 500-3000 W, and gas flows in the range of 100-1200 sccm. Non-limiting examples of gases used include polymerizing fluorocarbons, particularly $C_4F_8$ and $SF_6$, with flows of $SF_6$ from 0-15% of the fluorocarbon flow. In addition to $C_4F_8$, other polymerizing gases such as $C_4F_6$ can be used.

In some cases, particularly after an oxidative deposition clearing step, the silicon will be oxidized such that alternative Silicon Oxide removal is necessary. This will require the addition of other fluorocarbons to the $CF_4$ or substitution of $CF_4$ with these fluorocarbons. Alternative fluorocarbons can be $CHF_3$, $CH_2F_2$, $C_2F_6$, $C_2F_4H_2$ and combinations thereof. The flows of fluorocarbons will be similar to the flows of $CF_4$ 100 to 500 sccm. In addition it may be of value to deliberately oxidize the scallop peaks, as indicated above with clearing or partial clearing of excess polymer. The removal of partially oxidized scallops is achieved more effectively using these fluorocarbons rather than $CF_4$ only.

The foregoing description of various preferred embodiments of the invention have been presented for purposes of illustration and description. It is not intended to be exhaustive or to limit the invention to the precise forms disclosed, and obviously many modifications and variations are possible. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of etching silicon in a plasma processing chamber, said method comprising:

operating the plasma processing chamber at a first pressure and a first bias to perform a first vertical etch in the silicon to create a hole having a first depth and a sidewall;

operating the plasma processing chamber at a second pressure and a second bias to perform a deposition of a protective layer on the sidewall;

operating the plasma processing chamber at a third pressure and a third bias to perform a second vertical etch to deepen the hole to a second depth and to create a second sidewall, the second sidewall including a first trough, a second trough and a peak, the first trough corresponding to the first sidewall, the second trough corresponding to the second sidewall, the peak being disposed between the first trough and the second trough; and operating the plasma processing chamber at a fourth pressure and a fourth bias to perform a third etch to reduce the peak, wherein the fourth bias is sufficient to induce ion bombardment to eliminate the peak.

2. The method of claim 1, wherein said operating the plasma processing chamber at a fourth pressure and a fourth bias to perform a third etch to reduce the peak comprises operating the plasma processing chamber with an operating pressure in the range of 15 to 100 mtorr.

3. The method of claim 2, wherein said operating the plasma processing chamber at a fourth pressure and a fourth bias to perform a third etch to reduce the peak comprises operating the plasma processing chamber at an operating bias in the range of 200 to 1000 V.

4. The method of claim 3, wherein said operating the plasma processing chamber at a fourth pressure and a fourth bias to perform a third etch to reduce the peak comprises operating the plasma processing chamber at the fourth pressure and the fourth bias to perform the third etch for 30-180 seconds.

5. The method of claim 4, wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

6. The method of claim 3, wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

7. The method of claim 2, wherein said operating the plasma processing chamber at a fourth pressure and a fourth bias to perform a third etch to reduce the peak comprises operating the plasma processing chamber at the fourth pressure and the fourth bias to perform the third etch for 30-180 seconds.

8. The method of claim 7, wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

9. The method of claim 2, wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

10. The method of claim 1, wherein said operating the plasma processing chamber at a fourth pressure and a fourth bias to perform a third etch to reduce the peak comprises operating the plasma processing chamber at an operating bias in the range of 200 to 1000 V.

11. The method of claim 10, wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

12. The method of claim 1, wherein said operating the plasma processing chamber at a fourth pressure and a fourth bias to perform a third etch to reduce the peak comprises operating the plasma processing chamber at the fourth pressure and the fourth bias to perform the third etch for 15-180 seconds, and wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

13. The method of claim 1, wherein said operating the plasma processing chamber at a fourth pressure and a fourth bias to perform a third etch to reduce the peak comprises operating the plasma processing chamber at the fourth pressure and the fourth bias to perform the third etch with one of NF3, CF4, SF6, and combinations thereof.

14. A method of etching silicon in a plasma processing chamber, said method comprising:

operating the plasma processing chamber to perform a first vertical etch in the silicon to create a hole having a first depth and a sidewall;

operating the plasma processing chamber to perform a deposition of a protective layer on the sidewall;

operating the plasma processing chamber to perform a second vertical etch to deepen the hole to a second depth and to create a second sidewall, the second sidewall including a first trough, a second trough and a peak, the first trough corresponding to the first sidewall, the second trough corresponding to the second sidewall, the peak being disposed between the first trough and the second trough;

providing a mixture of $CF_4$ and at least one of the group consisting of $CHF_3$, $CH_2F_2$, $C_2F_6$, $C_2F_4H_2$, and combinations thereof; and operating the plasma processing chamber to perform a third etch to eliminate the peak.

15. The method of claim 14, wherein said operating the plasma processing chamber to perform a third etch to eliminate the peak comprises operating the plasma processing chamber with an operating pressure in the range of 15 to 100 mtorr.

16. The method of claim 14, wherein operating the plasma processing chamber to perform a third etch to eliminate the peak comprises operating the plasma processing chamber with an operating bias in the processing chamber being in the range of 200 to 1000 V.

17. The method of claim 14, wherein said operating the plasma processing chamber to perform a third etch to eliminate the peak comprises operating the plasma processing chamber to perform a third etch for 30-180 seconds.

18. The method of claim 1, wherein said operating the plasma processing chamber at a fourth pressure and a fourth bias to perform a third etch to reduce the peak comprises operating the plasma processing chamber with an operating pressure in the range of 40 to 80 mtorr.

19. The method of claim 1, wherein said bias directs gas ions to the peaks so as to preferentially remove the peaks while maintaining the diameter of the etched hole.

* * * * *